US009590010B1

(12) United States Patent
Gottwald et al.

(10) Patent No.: US 9,590,010 B1
(45) Date of Patent: Mar. 7, 2017

(54) PERPENDICULAR MAGNETIC TUNNEL JUNCTION (PMTJ) DEVICES EMPLOYING A THIN PINNED LAYER STACK AND PROVIDING A TRANSITIONING START TO A BODY-CENTERED CUBIC (BCC) CRYSTALLINE / AMORPHOUS STRUCTURE BELOW AN UPPER ANTI-PARALLEL (AP) LAYER

(71) Applicant: QUALCOMM Incorporated, San Diego, CA (US)

(72) Inventors: Matthias Georg Gottwald, Leuven (BE); Jimmy Jianan Kan, San Diego, CA (US); Chando Park, Irvine, CA (US); Xiaochun Zhu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/079,634

(22) Filed: Mar. 24, 2016

(51) Int. Cl.
*H01L 29/66* (2006.01)
*H01L 27/22* (2006.01)
(Continued)

(52) U.S. Cl.
CPC .......... *H01L 27/228* (2013.01); *G11C 11/161* (2013.01); *H01L 43/02* (2013.01);
(Continued)

(58) Field of Classification Search
CPC ............... H01F 10/123; H01F 10/3272; H01F 10/3286; H01F 41/307; H01L 29/82;
(Continued)

(56) References Cited

U.S. PATENT DOCUMENTS 6,934,131 B2 * 8/2005 Mao et al. ............. B82Y 10/00
360/324.11
7,084,467 B2 8/2006 Gill
(Continued)

OTHER PUBLICATIONS

Gottwald, M. et al., "Scalable and thermally robust perpendicular magnetic tunnel junctions for STT-MRAM," Applied Physics Letters, vol. 106, 2015, AIP Publishing LLC, 4 pages.
(Continued)

*Primary Examiner* — Mohammed Shamsuzzaman
(74) *Attorney, Agent, or Firm* — Withrow & Terranova, PLLC

(57) ABSTRACT

Perpendicular magnetic tunnel junction (pMTJ) devices employing a pinned layer stack with a thin top anti-parallel (AP2) layer and having a transitioning layer providing a transitioning start to a body-centered cubic (BCC) crystalline/amorphous structure below the top anti-parallel (AP2) layer, to promote a high tunnel magnetoresistance ratio (TMR) with reduced pinned layer thickness are disclosed. A first anti-parallel (AP) ferromagnetic (AP1) layer in a pinned layer has a face-centered cubic (FCC) or hexagonal closed packed (HCP) crystalline structure. A transitioning material (e.g., Iron (Fe)) is provided in a transitioning layer between the AP1 layer and an AFC layer (e.g., Chromium (Cr)) that starts a transition from a FCC or HCP crystalline structure, to a BCC crystalline/amorphous structure. In this manner, a second AP ferromagnetic (AP2) layer disposed on the AFC layer can be provided in a reduced thickness BCC crystalline or amorphous structure to provide a high TMR with a reduced pinned layer thickness.

29 Claims, 10 Drawing Sheets

(51) Int. Cl.
*H01L 43/08* (2006.01)
*H01L 43/10* (2006.01)
*H01L 43/12* (2006.01)
*H01L 43/02* (2006.01)
*G11C 11/16* (2006.01)

(52) U.S. Cl.
CPC .............. *H01L 43/08* (2013.01); *H01L 43/10* (2013.01); *H01L 43/12* (2013.01)

(58) Field of Classification Search
CPC ......... H01L 43/02; H01L 43/10; H01L 43/12; H01L 43/08; H01L 27/228; G11C 11/161
USPC ................... 257/252, 421; 365/171; 427/131
See application file for complete search history.

(56) References Cited

U.S. PATENT DOCUMENTS

| | | | | |
|---|---|---|---|---|
| 7,190,560 B2* | 3/2007 | Gill | .................. | B82Y 10/00 360/324.11 |
| 7,357,995 B2 | 4/2008 | Parkin | | |
| 7,666,467 B2* | 2/2010 | Parkin | .................... | B82Y 10/00 427/131 |
| 7,928,524 B2* | 4/2011 | Kim | ..................... | B82Y 25/00 257/421 |
| 8,514,527 B2* | 8/2013 | Komagaki et al. | .... | B82Y 10/00 360/324.11 |
| 8,780,506 B1 | 7/2014 | Maat et al. | | |
| 9,099,124 B1* | 8/2015 | Freitag et al. | ....... | G01R 33/093 |
| 9,166,143 B1* | 10/2015 | Gan et al. | ............. | G11C 11/161 |
| 9,214,170 B2* | 12/2015 | Wang et al. | ........... | B82Y 10/00 |
| 9,263,667 B1* | 2/2016 | Pinarbasi | ................ | H01L 43/02 |
| 9,281,466 B2* | 3/2016 | Sandhu et al. | .......... | H01L 43/08 |
| 9,337,412 B2* | 5/2016 | Pinarbasi et al. | ..... | G11C 11/161 |
| 9,461,242 B2* | 10/2016 | Sandhu et al. | ........ | G11C 11/161 |
| 9,520,553 B2* | 12/2016 | Siddik et al. | ........... | H01L 43/08 |
| 2005/0185454 A1* | 8/2005 | Brown et al. | ........... | H01L 43/08 365/171 |
| 2007/0297102 A1* | 12/2007 | Gill | ........................ | B82Y 10/00 360/324.11 |
| 2012/0299132 A1* | 11/2012 | Lin | ...................... | G11B 5/3909 257/421 |
| 2012/0299134 A1* | 11/2012 | Jan et al. | ................ | H01L 43/08 257/421 |
| 2013/0292785 A1* | 11/2013 | Zhou et al. | ........... | G11C 11/161 257/421 |
| 2014/0070341 A1* | 3/2014 | Beach et al. | ........... | H01L 29/82 257/421 |
| 2014/0242418 A1* | 8/2014 | Shukh | ................... | G11C 11/161 428/811.1 |
| 2015/0287908 A1* | 10/2015 | Gan et al. | ........... | H01F 10/3286 257/421 |
| 2015/0303373 A1* | 10/2015 | Chen et al. | ............. | H01L 43/02 257/421 |
| 2015/0325783 A1* | 11/2015 | Wang et al. | ........ | H01F 10/3286 257/421 |
| 2016/0181508 A1* | 6/2016 | Lee et al. | ................ | H01L 43/02 257/421 |

OTHER PUBLICATIONS

Parkin, S. S. P. et al., "Oscillations in Exchange Coupling and Magnetoresistance in Metallic Superlattice Structures: Co/Ru, Co/Cr, and Fe/Cr," Physical Review Letters, vol. 64, No. 19, May 7, 1990, The American Physical Society, pp. 2304-2307.

* cited by examiner

| 20nm MTJ DIAMETER TARGET | c-SAF (200) | pMTJ (400) |
|---|---|---|
| AP1 LAYER (420) | [Co5/Pt3]$_{xn}$/ Co5A | [Co5/Pt3]$_{xn}$/ Fe5A |
| AFC LAYER (418) | Ru(~8.5A) | Cr(~9A) |
| AP2 LAYER (422) | [Co5/Pt3]$_{x4}$/ Fe-Ta 8.5A/CoFeB 8A | CoFeB 8A |
| NECESSARY # N OF [Co/Pt] MULTILAYERS IN AP1 TO REACH PERPENDICULAR $H_{dip}$ < 100 Oe AT FREE LAYER LEVEL FOR 20nm DIAMETER DEVICE | >>50 | ~2-3 |
| AP1 LAYER (420) THICKNESS ASSUMING N AS ABOVE FOR 20nm DIAMETER MTJ | >>40.5 nm | ~2.1-2.9 nm |
| AP2 LAYER (422) THICKNESS | ~5 nm | ~0.8 nm |
| TOTAL THICKNESS OF AP1 LAYER (420) + AP2 LAYER (422) + AFC LAYER (418) ASSUMING N AS ABOVE FOR 20nmT DIAMETER MTJ | >>46 nm | ~3.8-4.6 nm |
| TOTAL OF LAYERS IN AP1 LAYER (420) + AP2 LAYER (422) + AFC LAYER (418) ASSUMING N AS ABOVE FOR 20nm DIAMETER MTJ | 112 | 7-9 |

FIG. 6

PERPENDICULAR MAGNETIC TUNNEL JUNCTION (PMTJ) DEVICES EMPLOYING A THIN PINNED LAYER STACK AND PROVIDING A TRANSITIONING START TO A BODY-CENTERED CUBIC (BCC) CRYSTALLINE / AMORPHOUS STRUCTURE BELOW AN UPPER ANTI-PARALLEL (AP) LAYER

BACKGROUND

I. Field of the Disclosure

The technology of the disclosure relates generally to the structure of magnetic tunnel junction (MTJ) devices that can be used, for example, in magnetic random access memory (MRAM) for storage of data.

II. Background

Semiconductor storage devices are used in integrated circuits (ICs) in electronic devices to provide data storage. One example of a semiconductor storage device is a magnetic random access memory (MRAM). MRAM is non-volatile memory in which data is stored by programming a magnetic tunnel junction (MTJ) as part of an MRAM bit cell. One advantage of an MRAM is that MTJs in MRAM bit cells can retain stored information even when power is turned off. Data is stored in the MTJ as a small magnetic element rather than as an electric charge or current.

In this regard, FIG. 1 is an illustration of an MTJ 100 provided in an MRAM bit cell to store data as a function of magnetization directions of two (2) layers in the MTJ 100. Data is stored in the MTJ 100 according to the magnetic orientation between two layers: a free layer 102 disposed above a pinned layer 104. In the MTJ 100, the free and pinned layers 102, 104 are formed from a ferromagnetic material with perpendicular magnetic anisotropy (i.e., the magnetization direction is perpendicular to a layer plane), to form a perpendicular MTJ (pMTJ). However, the aspects of the disclosure are not so limited, and the magnetization directions in the MTJ 100 according to the disclosure may be parallel to the plane of the layers therein. The MTJ 100 is configured in a "bottom-pinned" configuration wherein the pinned layer 104 is disposed below the free layer 102. The free and pinned layers 102, 104 are separated by a tunnel junction or tunnel barrier layer 106, formed by a thin non-magnetic dielectric layer. The free and pinned layers 102, 104 can store information even when the magnetic H-field is '0' due to a hysteresis loop 108 of the MTJ 100. Electrons can tunnel through the tunnel barrier layer 106 if a bias voltage is applied between two electrodes 110, 112 coupled on ends of the MTJ 100. The tunneling current depends on the relative orientation of the free and pinned layers 102, 104. When using a spin-torque-transfer (STT) MTJ (not shown), the difference in the tunneling current as the spin alignment of the free and pinned layers 102, 104 is switched between being parallel (P) and anti-parallel (AP) is known as a tunnel magnetoresistance (TMR) ratio.

When the magnetic orientation of the free and pinned layers 102, 104 is AP (shown in FIG. 1 as MTJ 100), a first memory state exists (e.g., a logical '1') (also referred to herein as an "AP state"). When the magnetic orientation of the free and pinned layers 102, 104 is P (shown in FIG. 1 as MTJ 100"), a second memory state exists (e.g., a logical '0') (also referred to herein as a "P state"). The magnetic orientation of the free and pinned layers 102, 104 can be detected in order to read data stored in the MTJ 100 by sensing the resistance when current flows through the MTJ 100. Data can be written and stored in the MTJ 100 by applying a magnetic field or electrical current to change the magnetic orientation of the free layer 102 to either a P or AP magnetic orientation with respect to the pinned layer 104. The magnetic orientation of the free layer 102 can be changed, but the magnetic orientation of the pinned layer 104 is fixed.

When reading data stored in the MTJ 100, a read voltage differential is applied between the electrodes 110, 112 to allow current to flow through the MTJ 100. A low resistance, as measured by a voltage differential between the electrodes 110, 112 divided by a measured current, is associated with a P magnetic orientation between the free and pinned layers 102, 104, and thus, the MTJ 100 is considered as being in a P state. A high resistance is associated with an AP magnetic orientation between the free and pinned layers 102, 104, and thus, the MTJ 100 is considered as being in an AP state. When writing data to the MTJ 100, a write voltage differential is applied between the electrodes 110, 112 to generate a write current through the MTJ 100. If the state of the MTJ 100 is to be changed from a P state to an AP state, a write current ($I_{P\text{-}AP}$) flowing from the bottom electrode 112 to the top electrode 110 is produced to induce a STT at the free layer 102 to change the magnetic orientation of the free layer 102 to be AP with respect to the pinned layer 104. This is shown by the MTJ 100' in FIG. 1. If, on the other hand, the state is to be changed from an AP state to a P state, a write current ($I_{AP\text{-}P}$) flowing from the top electrode 110 to the bottom electrode 112 is generated to induce a STT at the free layer 102 to change the magnetic orientation of the free layer 102 to be P with respect to the pinned layer 104. This is shown by the MTJ 100 in FIG. 1.

FIG. 2 is a schematic diagram illustrating exemplary layers of a conventional pMTJ 200 provided in an MTJ stack structure 202 that can be employed in the MTJ 100 in FIG. 1. The pMTJ 200 includes highly reliable pinned/reference layers that can be provided by high perpendicular magnetic anisotropy (PMA) materials (i.e., materials having a perpendicular magnetic easy axis). In this regard, the MTJ stack structure 202 includes a pinned layer 204 of a high PMA material disposed on a seed layer 205 (e.g., a Ta/Pt bilayer) above a bottom electrode 206 (e.g., made of TaN) electrically coupled to the pinned layer 204. A tunnel barrier layer 208 provided in the form of a Magnesium Oxide (MgO) layer in this example is disposed above the pinned layer 204. An MgO tunnel barrier layer 208 has been shown to provide a high TMR. A free layer 210, shown as a Cobalt (Co)-Iron (Fe)-Boron (B) (CoFeB) layer in this example, is disposed above the tunnel barrier layer 208. The CoFeB free layer 210 is a high PMA material that allows for effective current-induced magnetization switching for a low current density. A conductive, non-magnetic capping layer 212, such as a Tantalum (Ta) and/or thin Magnesium Oxide (MgO) material for example, is disposed above the free layer 210 to protect the layers of the MTJ stack structure 202. A top electrode 214 is disposed above the capping layer 212 to provide an electrical coupling to the free layer 210.

In the MTJ stack structure 202 in FIG. 2, the magnetic orientation of the pinned layer 204 is fixed. Accordingly, the pinned layer 204 generates a constant magnetic field, also known as a "net stray dipolar field," that may affect, or "bias," a magnetic orientation of the free layer 210. This magnetic field bias, at best, can cause an asymmetry in the magnitude of current necessary to change the magnetic orientation of the free layer 210 (i.e., $I_{P\text{-}AP}$ is different than $I_{AP\text{-}P}$). The current necessary to change the magnetic orientation of the free layer 210 towards the bias orientation is reduced while the current necessary to change the magnetic orientation of the free layer 210 against the bias is increased. At worst, this magnetic field bias can be strong enough to "flip" the value of a memory bit cell employing the pMTJ 200 in FIG. 2, thus decreasing the reliability of the subject MRAM.

In this regard, to reduce or prevent a magnetic field bias being provided by the pinned layer 204 on the free layer 210, the pinned layer 204 in the MTJ stack structure 202 in FIG. 2 includes a synthetic anti-ferromagnetic (SAF) structure 216. The SAF structure 216 includes a hard, first anti-parallel ferromagnetic (AP1) layer and a second anti-parallel ferromagnetic (AP2) layer separated by a non-magnetic anti-ferromagnetic coupling (AFC) layer 218 (e.g., a Ru layer). The AP1 and AP2 layers are permanently magnetized and magnetically coupled in opposite orientations to generate opposing magnetic fields. The opposing magnetic fields produce a zero or near-zero net magnetic field towards the free layer 210, thus reducing the magnetic field bias problem at the free layer 210. The AP1 and AP2 layers are provided as face-centered cubic (FCC) or hexagonal closed packed (HCP) crystalline structure materials, such as Co—Pt layers, to provide a very high anisotropy material to provide a highly stable magnetic reference configuration.

In order to achieve higher TMR in this MTJ stack structure 202, a CoFeB spin polarization enhancing layer 222, as well as the MgO tunnel barrier layer 208, preferentially has a body-centered cubic (BCC) crystalline structure with [001] orientation of the crystalline grains along the growth axis of the MTJ stack structure 202. Typically, the CoFeB spin polarization enhancing layer 222 and the MgO tunnel barrier layer 208 are mostly amorphous as deposited. Crystallization is usually induced through a post deposition annealing step at temperatures between 250-400° Celsius (C) for a duration between ten (10) and one hundred twenty (120) minutes, for example. The orientation of the developed crystalline grains of this CoFeB spin polarization enhancing layer 222 and MgO tunnel barrier layer 208 after annealing strongly depends on the template created by the layers below the CoFeB spin polarization enhancing layer 222 and the MgO tunnel barrier layer 208. If the templating layers below the CoFeB spin polarization enhancing layer 222 and MgO tunnel barrier layer 208 are amorphous or BCC with [001] orientation along the growth axis, the CoFeB spin polarization enhancing layer 222 and MgO tunnel barrier layer 208 will crystallize with BCC structure and [001] orientation along the growth axis. This crystallization with BCC structure and [001] orientation will lead to higher TMR. However, if the CoFeB spin polarization enhancing layer 222 and MgO tunnel barrier layer 208 are directly grown on a FCC or HCP material like Ru or [Co/Pt], which are part of the AP1 layer and AP2 layer, a crystallization of the CoFeB spin polarization enhancing layer 222 and MgO tunnel barrier layer 208 different from BCC [001] occurs and leads to lower TMR.

In this regard, a texture breaking layer 220, provided in the form of an Iron (Fe)—Ta material in this example, is disposed above the Co—Pt layers in the AP2 layer. The CoFeB spin polarization enhancing layer 222 is disposed above the texture breaking layer 220 in the AP2 layer. The MgO material for the tunnel barrier layer 208 is then deposited on top of the CoFeB spin polarization enhancing layer 222. In a post deposition annealing step, both the CoFeB spin polarization enhancing layer 222 as well as the MgO tunnel barrier layer 208 can crystallize with BCC [001] structured grains on top of the texture breaking layer 220. With the BCC [001] crystallized grains of the CoFeB spin polarization enhancing layer 222 and the MgO tunnel barrier layer 208, a higher TMR can be achieved if an appropriate free layer (e.g., the CoFeB free layer 210) is chosen on top of the MgO tunnel barrier layer 208.

However, in a scaled device (e.g., a pMTJ pillar with 20 nanometer (nm) diameter) the SAF structure 216 of the pMTJ 200 in FIG. 2 that forms the pinned layer 204 provides the AP1 and AP2 layers disposed below the tunnel barrier layer 208 may include more than twenty (100) layers each having a thickness between 2-20 Angstroms (A), providing for a thicker pinned layer 204 disposed below the tunnel barrier layer 208. For example, the AP2 layer may be 5.0 nm thick as an example and the AP1 layer may be 40 nm thick in order to reach an average dipolar perpendicular stray field acting on the free layer 210, which is smaller than 200 Oe for a device patterned to a 20 nm diameter pillar. Consequently, the overall thickness of the pinned layer 204 in this example might be larger than 45 nm Thus during fabrication, imperfections or variations due to uneven deposition of materials across the planes of the layers can propagate through the MTJ stack structure 202 as material layers forming the AP1 and AP2 layers, thus creating a "rough" surface at a base of the tunnel barrier layer 208. In general, thicker layers below the tunnel barrier layer 208 will lead to an increased roughness of the MTJ stack structure 202 at the level of the tunnel barrier layer 208. Because the tunnel barrier layer 208 is a relatively thin layer (e.g., 5-15 A), roughness at the base of the tunnel barrier layer 208 may degrade the functionality of the pMTJ 200 by reducing the TMR and reduction of the perpendicular anisotropy of the free layer 210 on top of the tunnel barrier layer 208. Further, roughness in the layers in the MTJ stack structure 202 can lead to increased inter-diffusion among layers, thus making the MTJ stack structure 202 less tolerant towards exposure to high temperature annealing cycles as typically encountered during back end of line (BEOL) CMOS fabrication.

In addition, the AP1 layer thickness in the pMTJ 200 may need to be increased at a scaled diameter in order to compensate (i.e., provide a greater opposite magnetic field to the AP2 layer) for the larger distance from the free layer 210 due to the thickness of the AP2 layer. This is shown by example in an exemplary graph 300 in FIG. 3, where the net dipolar stray field ($H_{dip}[O_e]$) generated by the pinned layer 204 in the pMTJ 200 in FIG. 2 increases for a reduced number of layers provided in the AP1 layer for a given diameter of the pMTJ 200 (e.g., 20 nm). The net dipolar stray field can be reduced with an increase in the number of layers in the AP1 layer of the pMTJ 200. However, an increased AP1 layer thickness makes interlayer roughness control and integration in advanced nodes with reduced intermetal height difficult. An increased AP1 layer thickness also increases the moment difference between the AP1 layer and the AP2 layer, thus creating a higher spin flip risk.

SUMMARY OF THE DISCLOSURE

Aspects of the present disclosure involve perpendicular magnetic tunnel junction (pMTJ) devices employing a thin pinned layer stack with a thin upper anti-parallel (AP) layer (AP2 layer). Another aspect of the present disclosure involves employing a combination of materials in the pMTJ device for a bottom anti-parallel (AP) layer (AP1 layer) and an anti-ferromagnetic coupling (AFC) layer in the thin pinned layer stack providing a transitioning start to a body-centered cubic (BCC) crystalline/amorphous structure below an upper AP layer (AP2 layer). This can promote a high tunnel magnetoresistance ratio (TMR) with reduced pinned layer thickness as an example. In this regard, in exemplary aspects disclosed herein, a pMTJ is provided that includes an MTJ stack structure. The MTJ stack structure includes a free layer and a pinned layer disposed on sides of a tunnel barrier layer having a body-centered cubic (BCC) crystalline/amorphous structure (e.g., a Magnesium Oxide (MgO) layer) to provide TMR. To reduce or prevent magnetic field bias of the pinned layer on the free layer, the pinned layer includes a synthetic anti-ferromagnetic (SAF) structure that includes a first anti-parallel (AP1) layer and a second anti-parallel (AP2) layer having opposite magnetic orientations separated by a non-magnetic anti-ferromagnetic coupling (AFC) layer. The AP1 layer includes two material systems. At least one part of the AP1 layer is provided as a high perpendicular magnetic anisotropy (PMA) material (e.g., a Cobalt (Co)-Platinum (Pt) layer structure) for providing a high perpendicular magnetic anisotropy. The material used for this first material system of the AP1 layer has a face-centered cubic (FCC) or hexagonal closed packed (HCP) crystalline structure. On top of this first material system of the AP1 layer, another material system tending to have an amorphous or NCC structure, like iron (Fe) or an Fe alloy for example, is grown. The AFC layer is disposed on the AP1 layer to provide an AFC coupling to the AP2 layer disposed above the AFC layer. The AP2 layer can be provided as a material having a BCC crystalline/amorphous structure at an interface with the tunnel barrier layer (e.g., a CoFe-Boron (B) (CoFeB) material) to promote growth of the tunnel barrier layer disposed on the AP2 layer to provide a high TMR with a strong anti-ferromagnetic coupling between the AP1 and AP2 layers.

In conventional pMTJ structures, the AP2 layer typically contains a texture breaking layer such as Co/Pt, Co, Ru having an FCC/HCP crystalline structure as typically used in the AP1 layer. The AFC layer and the spin polarization enhancing layer have a BCC crystalline/amorphous structure. In order to keep the AP2 layer as thin and simple (ideally only one layer deposition) as possible, the use of such a texture breaking layer is avoided in a suggested pMTJ structure. To avoid the need to provide a texture breaking layer in the AP2 layer, a transitioning material (e.g., Fe or Fe alloy) is provided in a transitioning layer as part of the AP1 layer. The transitioning layer starts a transition from a FCC and/or HCP crystalline structure of the AP1 layer to a BCC crystalline/amorphous structure of the AP2 layer. Providing the transitioning layer to transition to a BCC/amorphous structure below the AP2 layer allows thinning of the MTJ stack structure. The AP2 layer is disposed above an AFC layer provided as having a BCC crystalline/amorphous structure (e.g., Chromium (Cr) or Cr alloy) to provide an AFC coupling to the AP1 layer through the transitioning layer and to provide a template with BCC crystalline/amorphous structure for the AP2 layer deposited on top of the AFC layer. In this manner, the AP2 layer and the tunnel barrier layer can crystallize with BCC (e.g., BCC [001]) structured grains on top of the AFC coupling layer to achieve a higher TMR.

Further, by reducing the AP2 layer thickness, the AP1 layer thickness in the pinned layer may be further reduced or thinned to reduce or avoid issues from increased interlayer roughness while still providing a sufficient stray magnetic field compensation on the free layer, because the AP1 layer will be closer to the free layer as a result of the reduced AP2 layer thickness. In other words, the lower the AP2 layer thickness and moment, the less concern the effects AP1 layer thickness and moment. The reduced thickness and moment of the AP2 layer also allows the AP1 layer to have a reduced moment difference between the AP1 layer and the AP2 layer, and thus to increase the spin flip field. Consequently, the reduction of the AP2 layer thickness leads to a reduced overall pinned layer thickness of the pMTJ. Providing a reduced pinned layer thickness in an MTJ stack structure can reduce the roughness at the base of the tunnel barrier layer, thus also promoting a high TMR and higher reliability. Increased AP1 layer and AP2 layer thicknesses also makes integration of the MTJ stack structure into metal-oxide (MOS) devices, as well as the etch process to form such MOS devices, more challenging.

In this regard in one aspect, a pMTJ is provided. The pMTJ comprises a bottom electrode and a top electrode. The pMTJ also comprises a pinned layer disposed between the bottom electrode and the top electrode. The pMTJ also comprises a free layer disposed between the pinned layer and the top electrode. The pMTJ also comprises a tunnel barrier layer disposed between the pinned layer and the free layer. The tunnel barrier layer is configured to provide a tunnel magnetoresistance between the pinned layer and the free layer. The pinned layer comprises a synthetic anti-ferromagnetic (SAF) structure. The SAF structure comprises a first anti-parallel (AP) layer having a first reference magnetic orientation, the first AP layer comprising a face-centered cubic (FCC) or hexagonal closed packed (HCP) crystalline structure material. The SAF structure also comprises an anti-ferromagnetic coupling (AFC) layer disposed above the first AP layer. The SAF structure also comprises a second AP layer disposed above the AFC layer, the second AP layer having a second reference magnetic orientation opposite of the first reference magnetic orientation, the second AP layer comprising a body-centered cubic (BCC) crystalline or amorphous structure. The SAF structure also comprises a transitioning layer disposed below the second AP layer to provide a transitioning start to the BCC crystalline or amorphous structure of the second AP layer.

In another aspect, a pMTJ is provided. The pMTJ comprises means for providing a bottom electrode and means for providing a top electrode. The pMTJ also comprises means for providing a pinned magnetization disposed between the means for providing the bottom electrode and the means for providing the top electrode. The pMTJ also comprises means for providing a free magnetization disposed between the means for providing the pinned magnetization and the means for providing the top electrode. The pMTJ also comprises means for providing a magnetoresistive tunnel barrier between the means for providing the pinned magnetization and the means for providing the free magnetization, for providing a tunnel magnetoresistance between the means for providing the pinned magnetization and the means for providing the free magnetization. The means for providing the pinned magnetization comprises means for providing a first anti-parallel (AP) reference magnetic orientation in a face-centered cubic (FCC) or hexagonal closed packed (HCP) crystalline structure. The means for providing the pinned magnetization also comprises means for providing a second AP reference magnetic orientation opposite of the means for providing the first AP reference magnetic orientation in a body-centered cubic (BCC) crystalline or amorphous structure. The means for providing the pinned magnetization also comprises means for anti-ferromagnetically coupling the means for providing the first AP reference magnetic orientation from the means for providing the second AP reference magnetic orientation. The means for providing the pinned magnetization also comprises means for providing a transitioning start to the means for providing the second AP reference magnetic orientation in the BCC crystalline or amorphous structure disposed at an interface of the means for anti-ferromagnetically coupling.

In another aspect, a method of forming a pMTJ is provided. The method comprises providing a bottom electrode and a top electrode. The method also comprises forming a pinned layer above the bottom electrode comprising forming a synthetic anti-ferromagnetic (SAF) structure above the bottom electrode. The forming of the SAF structure comprises forming a first anti-parallel (AP) layer having a first reference magnetic orientation and comprising a face-centered cubic (FCC) or hexagonal closed packed (HCP) crystalline structure material above the bottom electrode. The forming of the SAF structure also comprises forming a transitioning layer within the first AP layer to provide a transitioning start to a structure of a second AP layer. The forming of the SAF structure also comprises forming an anti-ferromagnetic coupling (AFC) layer above the transitioning layer. The forming of the SAF structure also comprises forming the second AP layer above the AFC layer, the second AP layer having a second reference magnetic orientation opposite of the first reference magnetic orientation, the second AP layer comprising a body-centered cubic (BCC) crystalline or amorphous structure. The forming of the SAF structure also comprises forming a tunnel barrier layer above the second AP layer, the tunnel barrier layer configured to provide a tunnel magnetoresistance between the pinned layer and a free layer. The forming of the SAF structure also comprises forming the free layer disposed above the pinned layer, between the pinned layer and the top electrode.

In another aspect, a memory bit cell is provided. The memory bit cell comprises an access transistor having a gate, a source, and a drain. The memory bit cell comprises a pMTJ. The pMTJ comprises bottom electrode and a top electrode. The pMTJ also comprises a pinned layer disposed between the bottom electrode and the top electrode. The pMTJ also comprises a free layer disposed between the pinned layer and the top electrode. The pMTJ also comprises a tunnel barrier layer disposed between the pinned layer and the free layer, the tunnel barrier layer configured to provide a tunnel magnetoresistance between the pinned layer and the free layer. The pinned layer comprising a synthetic anti-ferromagnetic (SAF) structure. The SAF structure comprises a first anti-parallel (AP) layer having a first reference magnetic orientation, the first AP layer comprising a face-centered cubic (FCC) or hexagonal closed packed (HCP) crystalline structure material. The SAF structure also comprises an anti-ferromagnetic coupling (AFC) layer disposed above the first AP layer. The SAF structure also comprises a second AP layer disposed above the AFC layer, the second AP layer having a second reference magnetic orientation opposite of the first reference magnetic orientation, the second AP layer comprising a body-centered cubic (BCC) crystalline or amorphous structure. The SAF structure also comprises a transitioning layer disposed below the second AP layer and configured to provide a transitioning start to the BCC crystalline or amorphous structure of the second AP layer. The gate of the access transistor is coupled to a word line. The bottom electrode of the pMTJ is coupled to the drain of the access transistor or the source of the access transistor. The top electrode of the pMTJ is coupled to a bit line.

BRIEF DESCRIPTION OF THE FIGURES

FIG. 6 is a table comparing the conventional pinned layer structure (c-SAF) in the pMTJ in FIG. 2 to a more scalable pinned layer provided in the pMTJ in FIG. 4;

DETAILED DESCRIPTION

Figure 1:
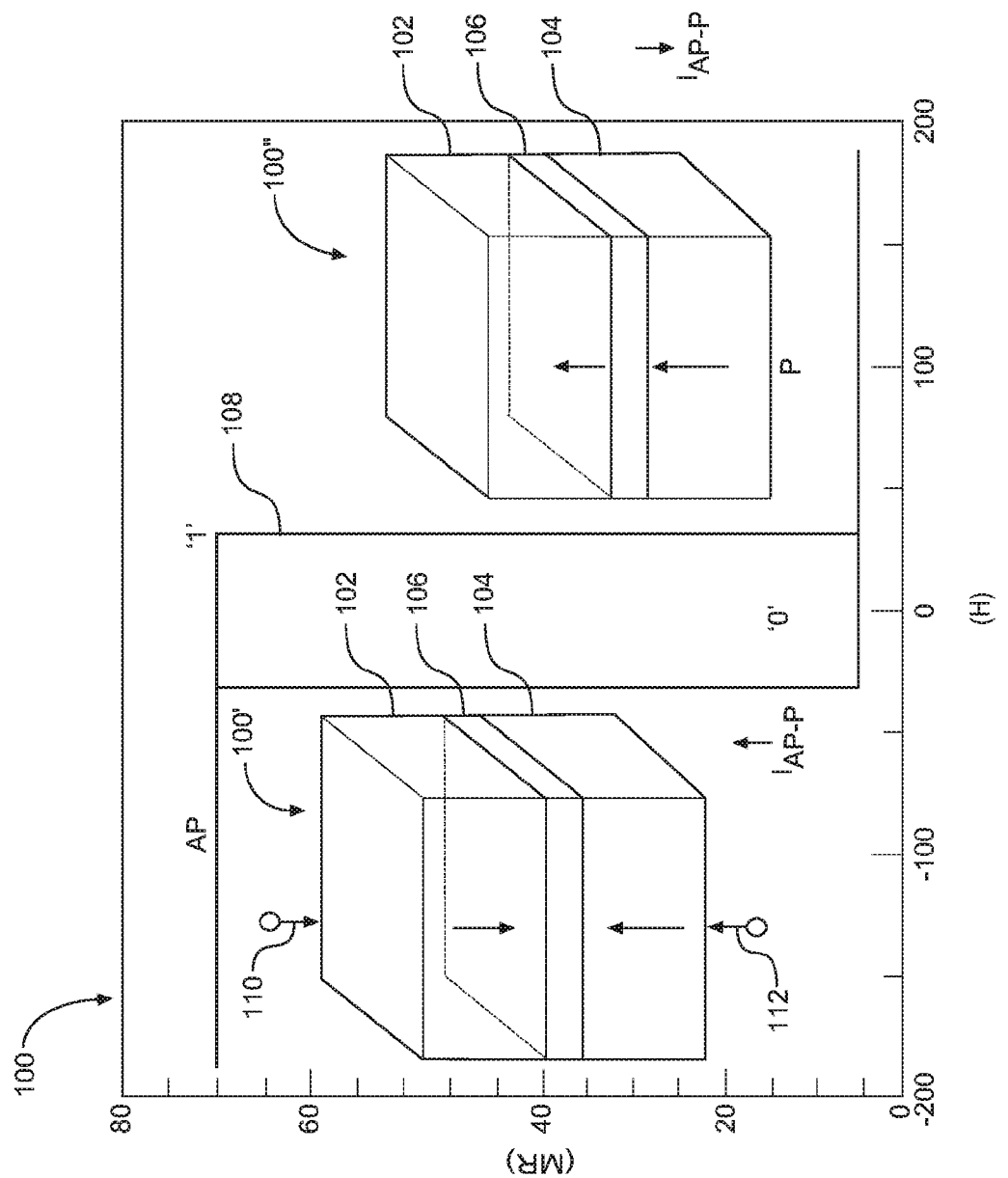
FIG. 1 is an exemplary perpendicular magnetic tunnel junction (pMTJ) provided in a magnetic random access memory (MRAM) bit cell to store data as a function of magnetization directions of a pinned layer and a free layer in the pMTJ.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure involve perpendicular magnetic tunnel junction (pMTJ) devices employing a thin pinned layer stack with an thin upper anti-parallel (AP) layer (AP2 layer). Another aspect of the present disclosure involves employing a combination of materials in the pMTJ device for a bottom anti-parallel (AP) layer (AP1 layer) and an anti-ferromagnetic coupling (AFC) layer in the thin pinned layer stack providing a transitioning start to a body-centered cubic (BCC) crystalline/amorphous structure below an upper AP layer (AP2 layer). This can promote a high tunnel magnetoresistance ratio (TMR) with reduced pinned layer thickness. In this regard, in exemplary aspects disclosed herein, a pMTJ is provided that includes an MTJ stack structure. The MTJ stack structure includes a free layer and a pinned layer disposed on sides of a tunnel barrier layer having a body-centered cubic (BCC) crystalline/amorphous structure (e.g., a Magnesium Oxide (MgO) layer) to provide TMR. To reduce or prevent magnetic field bias of the pinned layer on the free layer, the pinned layer includes a synthetic anti-ferromagnetic (SAF) structure that includes a first anti-parallel (AP1) layer and a second anti-parallel (AP2) layer having opposite magnetic orientations separated by a non-magnetic anti-ferromagnetic coupling (AFC) layer. At least one part of the AP1 layer is provided as a high perpendicular magnetic anisotropy (PMA) material (e.g., a Cobalt (Co)-Platinum (Pt) layer structure) for providing a high spin perpendicular magnetic anisotropy. The material used for the AP1 layer has a face-centered cubic (FCC) or hexagonal closed packed (HCP) crystalline structure. The AFC layer is disposed on the AP1 layer to provide an AFC coupling to the AP2 layer disposed above the AFC layer. The AP2 layer can be provided as a material having a BCC crystalline/amorphous structure at an interface with the tunnel barrier layer (e.g., a CoFe-Boron (B) (CoFeB) material) to promote growth of the tunnel barrier layer disposed on the AP2 layer to provide a high TMR with a strong anti-ferromagnetic coupling between the AP1 and AP2 layers.

To avoid the need to provide a texture breaking layer in the AP2 layer to provide a transition from the AP1 layer having a FCC/HCP crystalline structure of high PMA materials (e.g., Co/Pt and AFC materials like Ru), and the AP2 layer having a BCC crystalline/amorphous structure as needed for high TMR, a transitioning material (e.g., Iron (Fe) or Fe alloy) is provided in a transitioning layer (e.g., Iron (Fe) or Fe alloy) is provided at the interface between the AP1 layer and the AFC layer. The transitioning layer starts a transition from a FCC and/or HCP crystalline structure of the lower part of the AP1 layer (i.e., the Co/Pt multilayer) to a BCC crystalline/amorphous structure of the AP2 layer. Providing the transitioning layer to transition to a BCC/amorphous structure below the AP2 layer allows thinning of the MTJ stack structure. The AP2 layer is disposed above an AFC layer provided as having a BCC crystalline/amorphous structure (e.g., Chromium (Cr) or Cr alloy) to provide an AFC coupling to the AP1 layer through the transitioning layer and to provide a template with BCC crystalline/amorphous structure for the AP2 layer deposited on top of the AFC layer. In this manner, the AP2 layer and the tunnel barrier layer can crystallize with BCC (e.g., BCC [001]) structured grains on top of the transitioning AFC coupling layer to achieve a higher TMR.

Further, by reducing the AP2 layer thickness, the AP1 layer thickness in the pinned layer may be further reduced or thinned to reduce or avoid issues from increased interlayer roughness while still providing a sufficient stray magnetic field compensation on the free layer, because the AP1 layer will be closer to the free layer as a result of the reduced AP2 layer thickness. In other words, the lower the AP2 layer thickness and moment, the less concern the effects AP1 layer thickness and moment. The reduced thickness and moment of the AP2 layer also allows the AP1 layer to have a reduced moment, thus providing a reduced moment difference between the AP1 layer and the AP2 layer, and thus to reduce the spin flip risk field. Consequently, the reduction of the AP2 layer thickness also is provides for a reduced overall pinned layer thickness of the pMTJ. Providing a reduced pinned layer thickness in an MTJ stack structure can reduce the roughness at the base of the tunnel barrier layer, thus also promoting a high TMR and higher reliability. Increased AP1 and AP2 layer thicknesses also makes integration of the MTJ stack structure into metal oxide (MOS) devices, as well as the etch process to form such MOS devices, more challenging.

Figure 4:
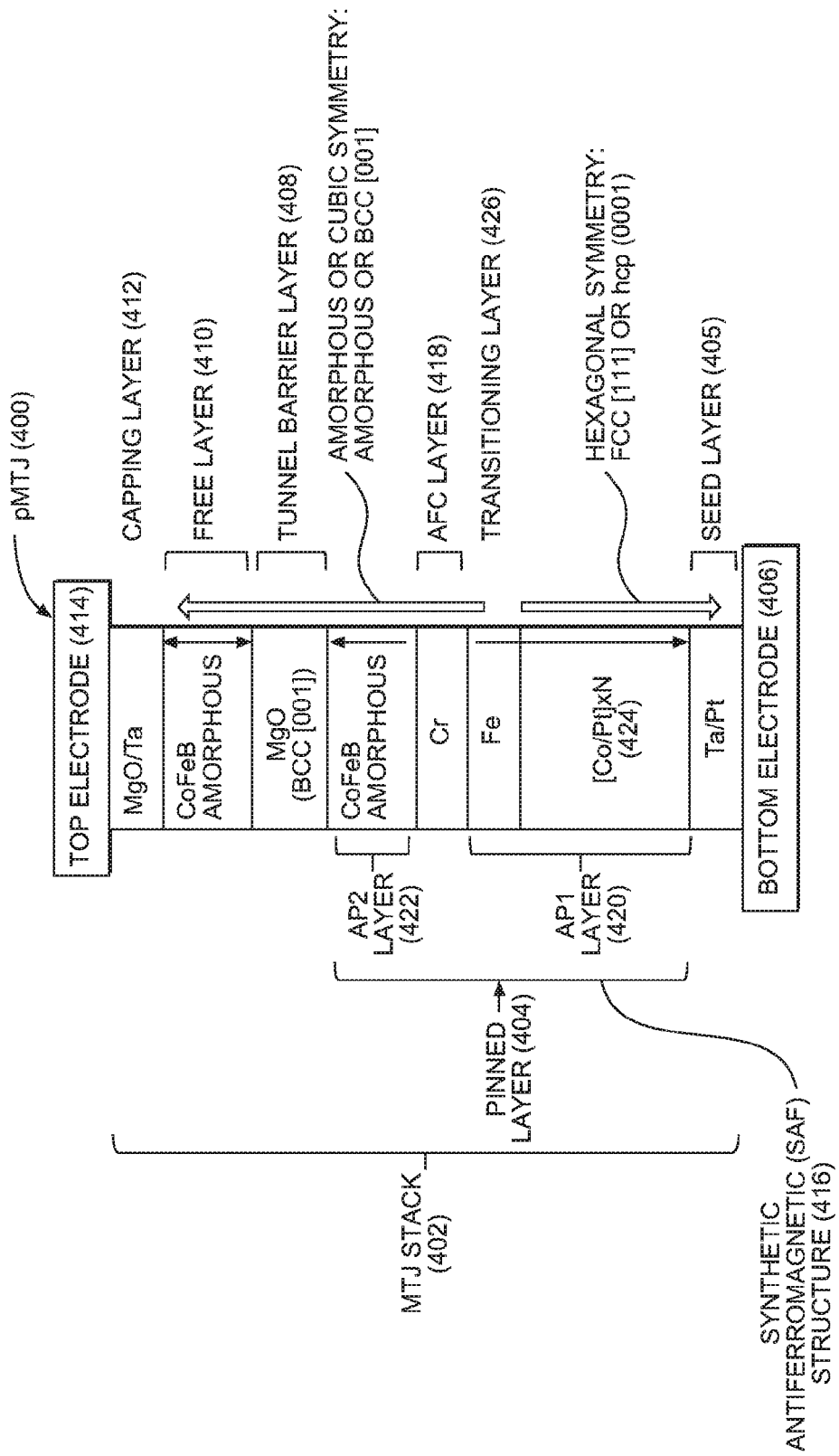
FIG. 4 is an exemplary pMTJ that has a pinned layer having a transitioning start to a body-centered cubic (BCC) crystalline/amorphous structure (e.g., from a face-centered cubic (FCC)/hexagonal closed packed (HCP) crystalline structure) below an AP2 layer to promote a high tunnel magnetoresistance ratio (TMR) with a reduced pinned layer thickness.

In this regard, FIG. 4 is an exemplary pMTJ 400 that has a MTJ stack structure 402. The MTJ stack structure 402 includes a pinned layer 404 and a free layer 410 disposed on sides of a tunnel barrier layer 408. The pinned layer 404 is conductively coupled to the bottom electrode 406. The free layer 410 is conductively coupled to a top electrode 414. A capping layer 412 may be disposed between the free layer 410 and the top electrode 414 to protect the free layer 410 during fabrication of the MTJ stack structure 402. The pinned layer 404 includes a SAF structure 416. As will be discussed in more detail below, the SAF structure 416 of the pinned layer 404 in this example includes a transitioning material to provide a transitioning start to a body-centered cubic (BCC) crystalline or amorphous structure (e.g., from a face-centered cubic (FCC) or a hexagonal closed packed (HCP) crystalline structure) below an AP2 layer 422. The transition start to a body-centered cubic (BCC) crystalline or amorphous structure can be employed to promote a high tunnel magnetoresistance ratio (TMR) in the pMTJ 400 with reduced pinned layer 404 thickness. A decrease in pinned layer 404 thickness can reduce interlayer roughness between different layers in the MTJ stack structure 402 of the pMTJ 400. This promotes higher thermal tolerance with respect to CMOS back end of line (BEOL) thermal cycles.

In this regard, with continuing reference to FIG. 4, the MTJ stack structure 402 of the pMTJ 400 includes a bottom electrode 406 as a seed layer to provide for a conductive coupling to the pMTJ 400, and more particularly to the pinned layer 404. The bottom electrode 406 can be formed on a substrate with the pinned layer 404 disposed above the bottom electrode 406. The bottom electrode 406 can also be formed on top of a metal line of a CMOS back end of line (BEOL) metallization structure. The pinned layer 404 may be formed directly on the bottom electrode 406. To reduce or prevent magnetic field bias of the pinned layer 404 on the free layer 410, the pinned layer 404 in the MTJ stack structure 402 in this example includes the SAF structure 416. The SAF structure 416 includes a first anti-parallel (AP1) layer 420 and the second anti-parallel (AP2) layer 422 having opposite magnetic orientations separated by a non-magnetic anti-ferromagnetic coupling (AFC) layer 418. The opposing magnetic fields produced by the AP1 layer 420 and the AP2 layer 422 can be configured to provide a zero or near-zero average net magnetic field towards the free layer 210, thus reducing a magnetic field bias provided by the pinned layer 404 at the free layer 210. In this example, the AP1 layer 420 is provided as a high perpendicular magnetic anisotropy (PMA) material for providing a stable and perpendicular oriented magnetization. In this example, the AP1 layer 420 is formed from a Cobalt (Co) and Platinum (Pt) multi-layer structure (e.g., film) 424, noted as [Co/Pt]*N in FIG. 4, where 'N' is the number of Co and Pt layers alternatively deposited above the bottom electrode 406. The ratio of the thickness of the Co layers to that of the Pt layers in the Cobalt and Pt-based structure 424 of the AP1 layer 420 may be 1:1 but less than 3:1 in one non-limiting example. The Co material employed in the Cobalt and Pt-based structure 424 AP1 layer 420 has a face-centered cubic (FCC) (e.g., FCC[1111]). The Pt material employed in the Cobalt and Pt-based structure 424 of the AP1 layer 20 has a hexagonal closed packed (HCP) (e.g., HCP[00011) crystalline structure.

With continuing reference to FIG. 4, the AP2 layer 422 is disposed above the AP1 layer 420 in the SAF structure 416 to provide an opposing perpendicular magnetic field to the AP2 layer 422. The non-magnetic AFC layer 418 is disposed above the AP1 layer 420, with the AP2 layer 422 disposed above the AFC layer 418. This provides an anti-ferromagnetic coupling between the AP1 layer 420 and the AP2 layer 422 in the SAF structure 416. A tunnel barrier layer 408, provided in the form of a Magnesium (Mg) Oxide (O) (MgO) material in this example, is disposed above the AP2 layer 422 between the free layer 410 and the AP2 layer 422. The tunnel barrier layer 408 may be on the order of 5-15 Angstroms (A) in thickness as an example. Using an MgO material as the tunnel barrier layer 408 has been found to provide a high TMR with a low resistance-area (R×A) product. The AP2 layer 422 in this example is also provided as a high PMA material to provide the perpendicular magnetization field in the AP2 layer 422 in the SAF structure 416. In this example, a Co-Iron (Fe)-Boron(b) (CoFeB) material (CoFeB) is used as the AP2 layer 422, because a CoFeB material has been found to promote growth of the MgO tunnel barrier layer 408 to provide a high TMR with a strong anti-ferromagnetic coupling between the AP1 layer 420 and the AP2 layer 422 and because CoFeB can show perpendicular magnetic anisotropy when in contact with MgO.

Also, by adding a texture breaking layer and substantially increasing the thickness of the AP2 layer 422, the AP1 layer 420 thickness in the MTJ stack structure 402 may need to be increased at a scaled diameter in order to compensate (i.e., provide a greater opposite magnetic field to the AP2 layer 422) due to be located a greater distance from the free layer 410 in the MTJ stack structure 402. Increasing the number of layers in the AP1 layer 420 can reduce the net dipolar stray field provided by the pinned layer 402 on the free layer 410. However, an increased AP1 layer 420 thickness makes interlayer roughness control and integration in advanced nodes with reduced intermetal height more difficult. An increased AP1 layer 420 thickness also increases the moment difference between the AP1 layer 420 and the AP2 layer 422, thus creating a higher spin flip risk Thus, in this example pMTJ 400 in FIG. 4, to avoid the need to provide a texture breaking layer in the AP2 layer 422 to provide a transition between the AP1 layer 420 having a FCC/HCP crystalline structure and the AP2 layer 422 and tunnel barrier layer 408 having a BCC crystalline/amorphous structure, a transitioning layer 426 is provided. The transitioning layer 426 is disposed in the AP1 layer 420 below the AP2 layer 422. The transitioning layer 426 is disposed as a last layer of the AP1 layer 420 in the SAF structure 416 at an interface with the AFC layer 418 in this example. The transitioning layer 426 starts the transition of the FCC/HCP crystalline structure of the AP1 layer 420 to the AP2 layer 422 and above having BCC crystalline/amorphous structures. In this example, the transitioning layer 426 is provided as a Fe material to provide a ferromagnetic material for antiferromagnetic coupling of the AP1 layer 420 to the AP2 layer 422 through the AFC layer 418. The Fe material in the transitioning layer 426 also being a BCC crystalline material provides the transition from the FCC/HCP crystalline structure material to BCC crystalline/amorphous materials. Thus, the AP2 layer 422 does not have to be provided in a greater thickness to allow for a texture breaking layer being included into the AP2 layer 422.

Figure 2:
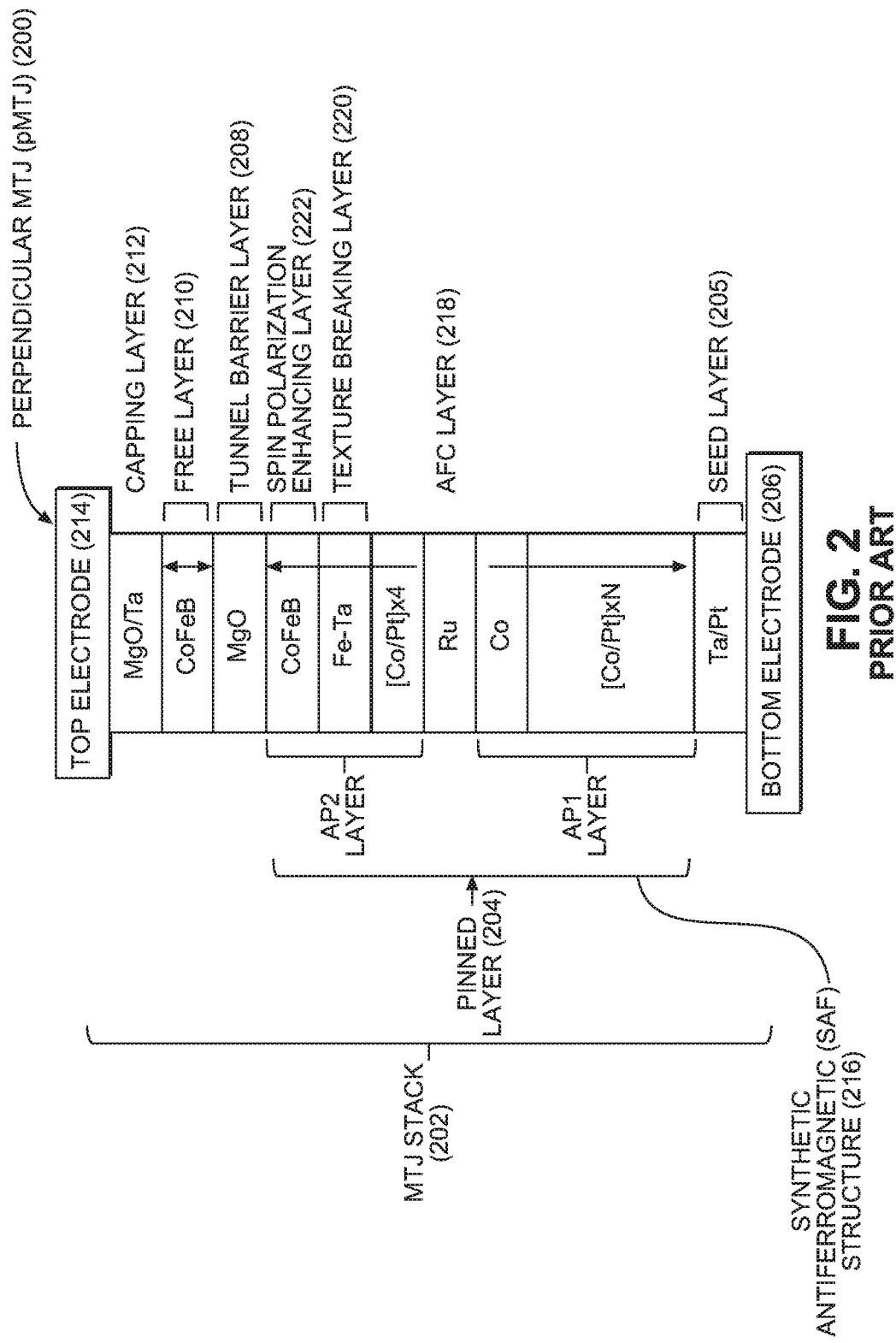
FIG. 2 is a schematic diagram illustrating a conventional perpendicular MTJ (pMTJ) and exemplary conventional layers provided therein.
Figure 3:
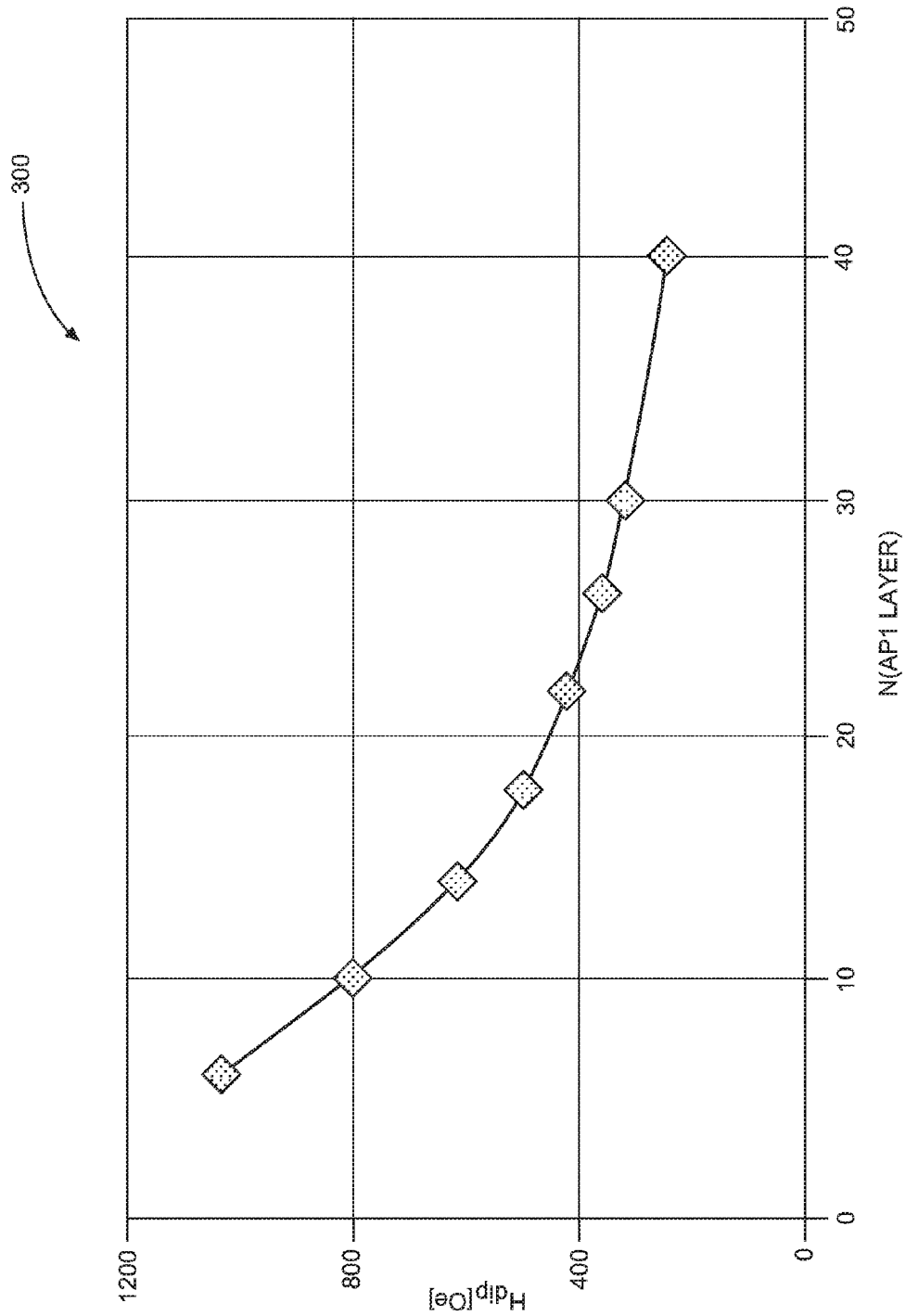
FIG. 3 is a graph illustrating a net dipolar stray field in the pinned layer of the pMTJ in FIG. 2 as a function of a number of layers in a first anti-parallel (AP1) layer in the pinned layer.
Figure 5:
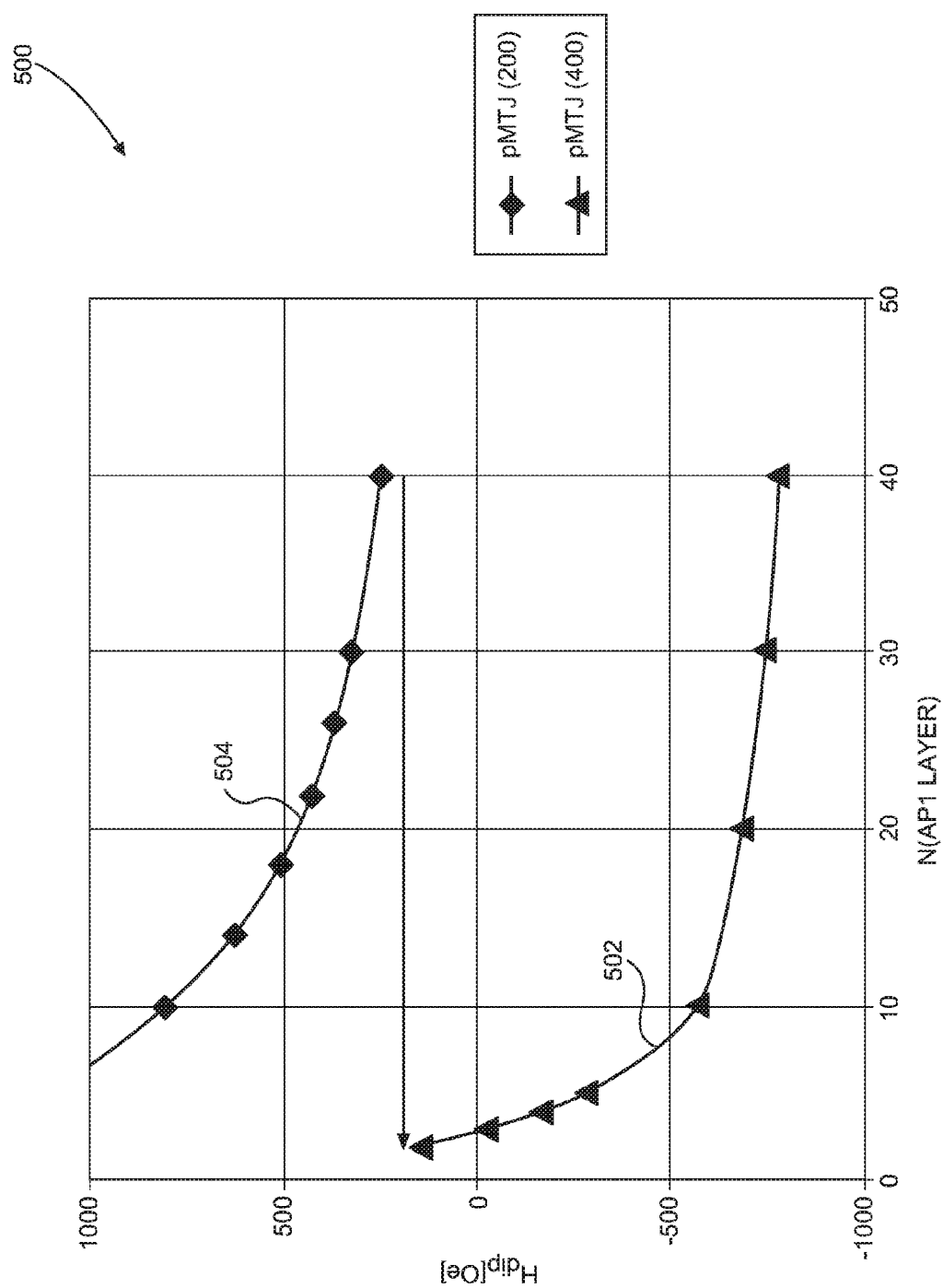
FIG. 5 is a graph illustrating the net dipolar stray field in the pinned layer of the pMTJs in FIGS. 2 and 4 as a function of the thickness of the AP1 layer in the pinned layer.

Also, by the AP2 layer 422 being reduced in thickness, the AP1 layer 420 can be reduced in thickness while still compensating the net average dipolar stray field applied to the free layer 410. Consequently, the overall thickness of the pinned layer 404 is reduced, which can reduce the roughness at the base of the tunnel barrier layer 408, thus also promoting a high TMR. Further, by reducing the AP2 layer 422 thickness, the AP1 layer 420 thickness in the pinned layer 404 may be further reduced or thinned while still providing a sufficient stray magnetic field compensation on the free layer 410, because the AP1 layer 420 will be closer to the free layer 410 as a result of the reduced AP2 layer 422 thickness. This is shown by example in a graph 500 in FIG. 5. Line 502 in FIG. 5 illustrates the net dipolar stray field ($H_{dip}[O_e]$) in the pinned layer 404 of the pMTJ 400 in FIG. 4 as a function of the reduced thickness of AP1 layer 420 in the pinned layer 404 according to 'N' alternating layers of Co—Pt layers. For exemplary comparison purposes, line 504 illustrates the net dipolar stray field ($H_{dip}[O_e]$) in the pinned layer 204 of the pMTJ 200 in FIG. 2 as a function of the thickness of AP1 layer in the pinned layer 204 that does not employ a transitioning layer like provided in the pMTJ 400 in FIG. 4.

In this example of the pMTJ 400 in FIG. 4, with the transitioning layer 426 provided below the AP2 layer 422 of the SAF structure 416 to start the transition of the MTJ stack structure 402 to a BCC crystalline or amorphous structure, the AFC layer 418 is provided as a BCC or amorphous structure above the transitioning layer 426. As discussed above, the CoFeB AP2 layer 422 promotes growth of the MgO tunnel barrier layer 408 disposed on the AP2 layer 422 to provide a high TMR with a strong anti-ferromagnetic coupling between the AP1 layer 420 and AP2 layer 422, but with reduced AP2 layer 422 thickness and overall pinned layer 404 thickness. In this regard, in the exemplary pMTJ 400 in FIG. 4, the AFC layer 418 is provided in the form of a BCC crystalline or amorphous structure. For example, this is opposed to use of a Ru FCC/HCP crystalline structure material as the AFC layer 418. The BCC/amorphous AFC layer 418 is disposed on the transition layer 426. FIG. 6 is a table 600 comparing a conventional pinned layer 204 structure (c-SAF) 204 in the pMTJ 200 in FIG. 2 as compared to the exemplary pinned layer 404 structure in the pMTJ 400 in FIG. 4.

Figure 7A:
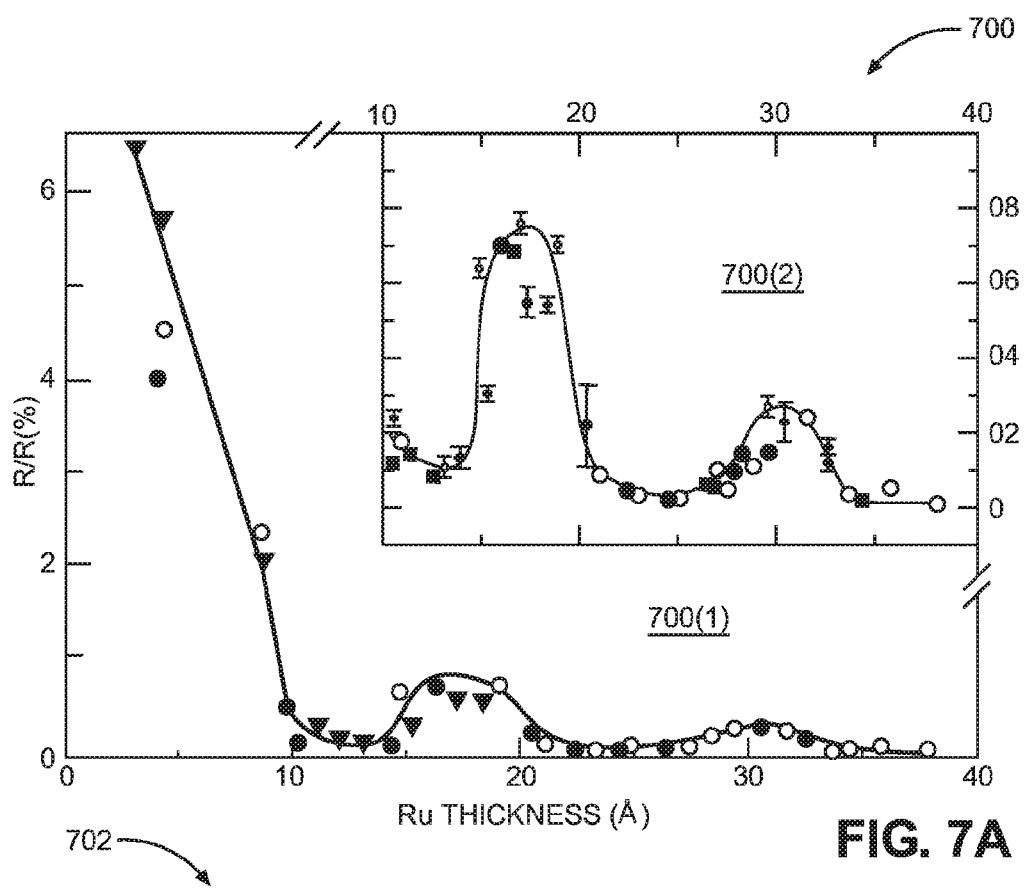
FIG. 7A is a graph illustrating an exemplary transverse saturation magnetoresistance of a Ruthenium (Ru) material used as an AFC material as a function of Ru thickness.
Figure 7B:
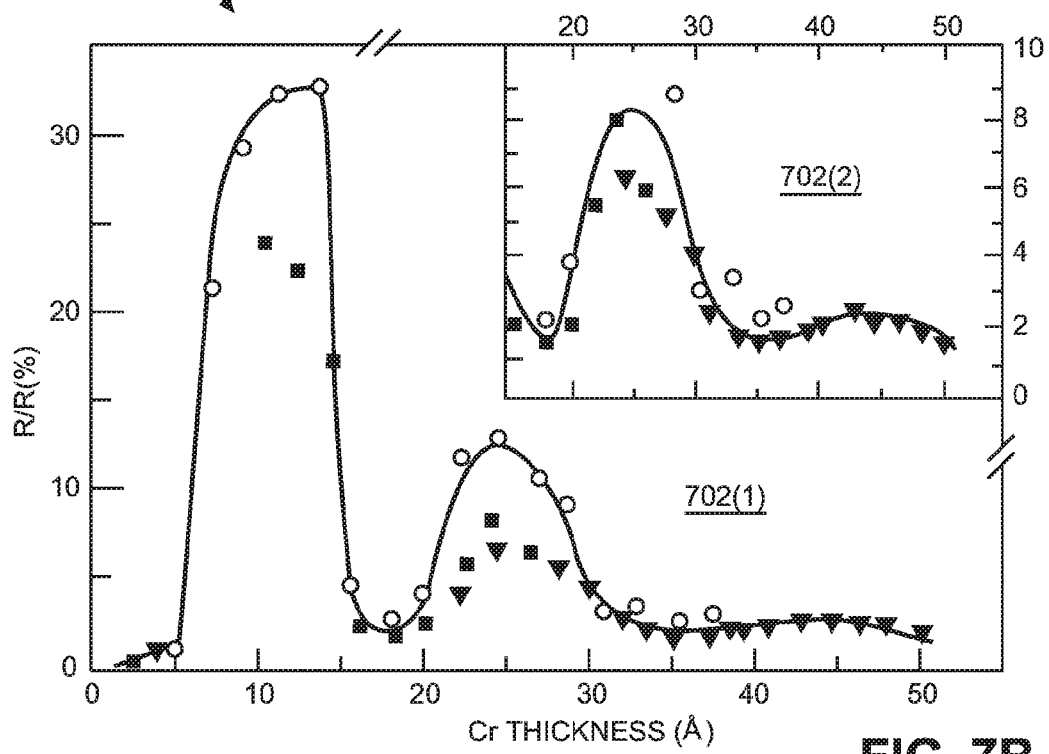
FIG. 7B is a illustrating an exemplary transverse saturation magnetoresistance of a Chromium (Cr) material used as an AFC material as a function of Cr thickness.

In this example, the AFC layer 418 is provided as a Chromium (Cr) material or Cr alloy (hereinafter "Cr AFC layer 418"). For example, the Cr used to provide the AFC layer 418 can be a Cr BCC crystalline structure. A Cr material has been found to provide strong anti-ferromagnetic coupling, and thus can be employed in the SAF structure 416 to provide a strong anti-ferromagnetic coupling between the AP1 layer 420 and the AP2 layer 422. This is shown by example in the exemplary graphs 700 and 702 in FIGS. 7A and 7B. See S. Parkin, Phys. Rev. Lett. 64, 2304—Published 7 May 1990 http://dx.doi.org/10.1103/PhysRevLett.64.2304. Graph 700(1) illustrates an exemplary transverse saturation magnetoresistance (Δ magnetoresistance (R)/R (%)) of a Ru material used as an AFC material as a function of Ru thickness between 0-40 A. Graph 700(2) is a condensed version of graph 700(1) in FIG. 7A illustrating the transverse saturation magnetoresistance (ΔR/R (%)) of a Ru material between 10-40 A. Compare graphs 700(1) and 700(2) in FIG. 7A to graph 702(1) in FIG. 7B, which illustrates an exemplary transverse saturation magnetoresistance (ΔR/R (%)) of a Cr material used as an AFC material as a function of Cr thickness. Graph 702(2) is a condensed version of graph 702(1) in FIG. 7B illustrating the transverse saturation magnetoresistance (ΔR/R (%)) of a Cr material between 10-40 A.

Figure 8A:
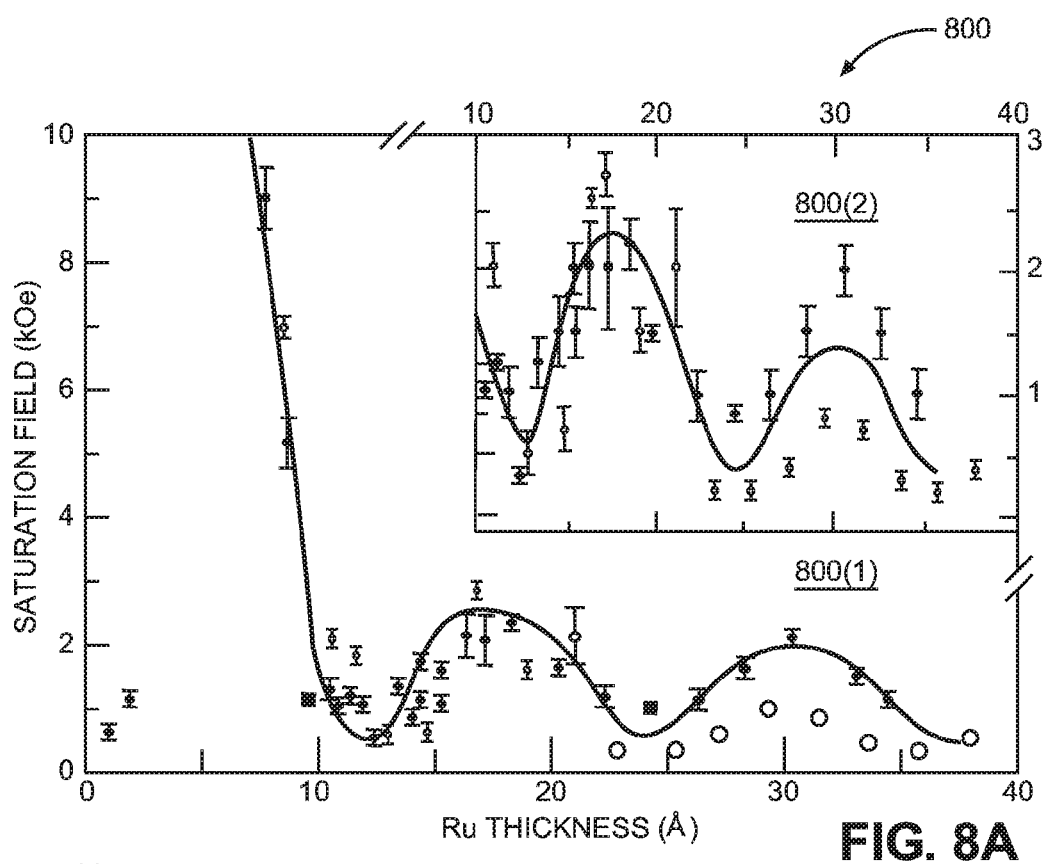
FIG. 8A is a graph illustrating an exemplary saturation field of a Ru material used as an AFC material as a function of Ru thickness.
Figure 8B:
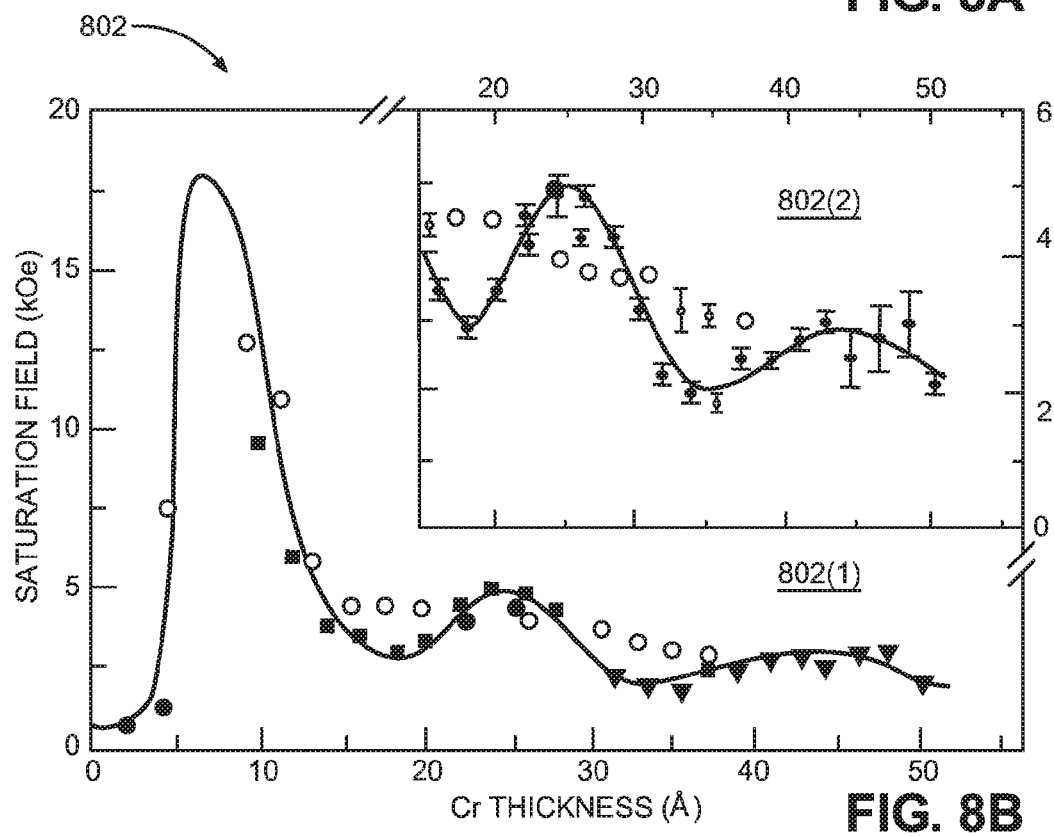
FIG. 8B is a graph illustrating an exemplary saturation field of a Cr material used as an AFC material as a function of Cr thickness.

Further, graph 800 in FIG. 8A illustrates an exemplary saturation field (kOe) of a Ru material used as an AFC material as a function of Ru thickness. See S. Parkin, Phys. Rev. Lett. 64, 2304—Published 7 May 1990 http://dx.doi.org/10.1103/PhysRevLett.64.2304. Graph 800(1) illustrates an exemplary saturation field (kOe) of a Ru material used as an AFC material as a function of Ru thickness. Graph 800(2) is a condensed version of graph 800(1) in FIG. 8A illustrating the saturation field of a Ru material between 10-40 A. Graph 802 in FIG. 8B illustrates an exemplary saturation field (kOe) of a Cr material used as an AFC material as a function of Cr thickness. See S. Parkin, Phys. Rev. Lett. 64, 2304—Published 7 May 1990 http://dx.doi.org/10.1103/PhysRevLett.64.2304. Graph 800(1) illustrates saturation field (kOe) of a Cr material used as an AFC material as a function of Ru thickness between 0-40 A. Graph 800(2) is a condensed version of graph 800(1) in FIG. 8A illustrating the saturation field of a Cr material between 10-40 A.

Figure 9:
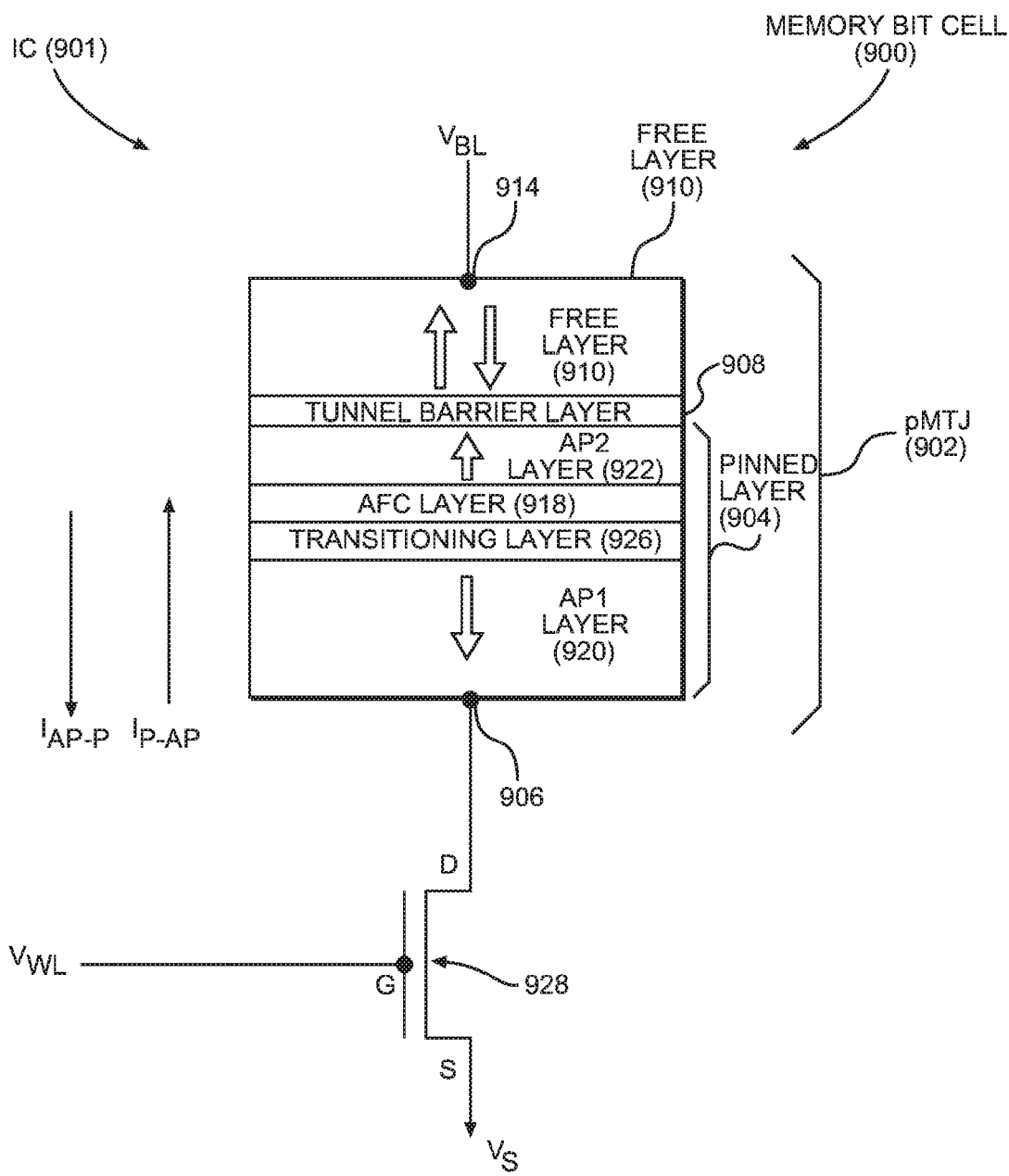
FIG. 9 is a schematic diagram of an memory bit cell employing a pMTJ that has a pinned layer having a transitioning start to a BCC crystalline/amorphous structure below an AP2 layer to promote a high TMR with a reduced pinned layer thickness.

FIG. 9 is a schematic diagram of an memory bit cell 900 that includes a pMTJ 902 that includes a pinned layer 904 having a transitioning layer 926 providing a transitioning start to a BCC crystalline/amorphous structure below an AP2 layer 922. For example, the memory bit cell 900 can be provided in an integrated circuit (IC) 901 as a MRAM bit cell. The pMTJ 902 may be the pMTJ 400 illustrated in FIG. 4, as a non-limiting example. The memory bit cell 900 may be provided in a memory array and used as memory storage for any type of system requiring electronic memory, such as a central processing unit (CPU) or processor-based system, as examples. An access transistor 928, which is an n-type metal-oxide semiconductor (NMOS) transistor in this example (referred to hereafter as "NMOS access transistor 928") is provided to control reading and writing to the pMTJ 902 in this example. A drain (D) of the NMOS access transistor 928 is coupled to a bottom electrode 906 of the pMTJ 902, which is coupled to an AP1 layer 920 of the pinned layer 904. A word line ($V_{WL}$) is coupled to a gate (G) of the NMOS access transistor 928. A source (S) of the NMOS access transistor 928 is coupled to a voltage source ($V_S$). A bit line ($V_{BL}$) is coupled to a top electrode 914 of the pMTJ 902, which is coupled to a free layer 910. Similar to the pMTJ 400 in FIG. 4, the free layer 910 is disposed above a tunnel barrier layer 908 in the pMTJ 900, which is a BCC crystalline or amorphous structure. The tunnel barrier layer 908 is disposed above the AP2 layer 922 provided in a SAF structure 902. The AP2 layer 926 is disposed above the AFC layer 918, which is disposed above the transitioning layer 926 and the AP1 layer 920, respectively. The transitioning layer 926 provides a transitioning start to a BCC crystalline/amorphous structure from a FCC/HCP crystalline structure of the AP1 layer 920. An AFC layer 918 disposed on the transitioning layer 926 provides a strong anti-ferromagnetic coupling between the AP1 layer 920, which is a BCC crystalline or amorphous structure, and the AP2 layer 922. The AP2 layer 922 being a BCC crystalline or amorphous structure promotes growth of the tunnel barrier layer 908 thereon to provide a high TMR, and with a reduced AP2 layer 922 thickness, since a texture breaking layer is not required to be provided in the AP2 layer 922.

When reading data stored in the pMTJ 902, the bit line ($V_{BL}$) is activated for the NMOS access transistor 928 to allow current to flow through the pMTJ 902 between the top and bottom electrodes 914, 906. A low resistance, as measured by voltage applied on the bit line ($V_{BL}$) divided by the measured current, is associated with a P orientation between the free layer 910 and the net magnetic orientation of the AP1 and AP2 layers 922, i.e., a P state. A higher resistance is associated with an AP orientation between the free layer 910 and the net magnetic orientation of the AP1 and AP2 layers 920, 922, i.e., an AP state. When writing data to the pMTJ 902, the gate (G) of the NMOS access transistor 928 is activated by activating the word line ($V_{WL}$). A voltage differential between the bit line ($V_{BL}$) and the voltage source ($V_S$) is applied. As a result, a write current (I) (not shown) is generated between the drain (D) and the source (S). If the state of the pMTJ 902 is to be changed from AP to P, a write current ($I_{AP-P}$) flowing from the top electrode 914 to the bottom electrode 906 is generated, which induces a spin-torque-transfer (STT) at the free layer 910 to change the magnetic orientation of the free layer 814 to a P state with respect to the net magnetic orientation of the AP1 and AP2 layers 920, 922. If the state of the pMTJ 902 is to be changed from a P state to an AP state, a current ($I_{P-AP}$) flowing from the bottom electrode 906 to the top electrode 914 is produced, which induces an STT at the free layer 910 to change the magnetic orientation of the free layer 910 to an AP state with respect to the net magnetic orientation of the AP1 and AP2 layers 920, 922.

Memory components that include pMTJs that include a pinned layer having a transitioning layer providing a transitioning start to a body-centered cubic (BCC) crystalline/amorphous structure below an AP2 layer may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 10:
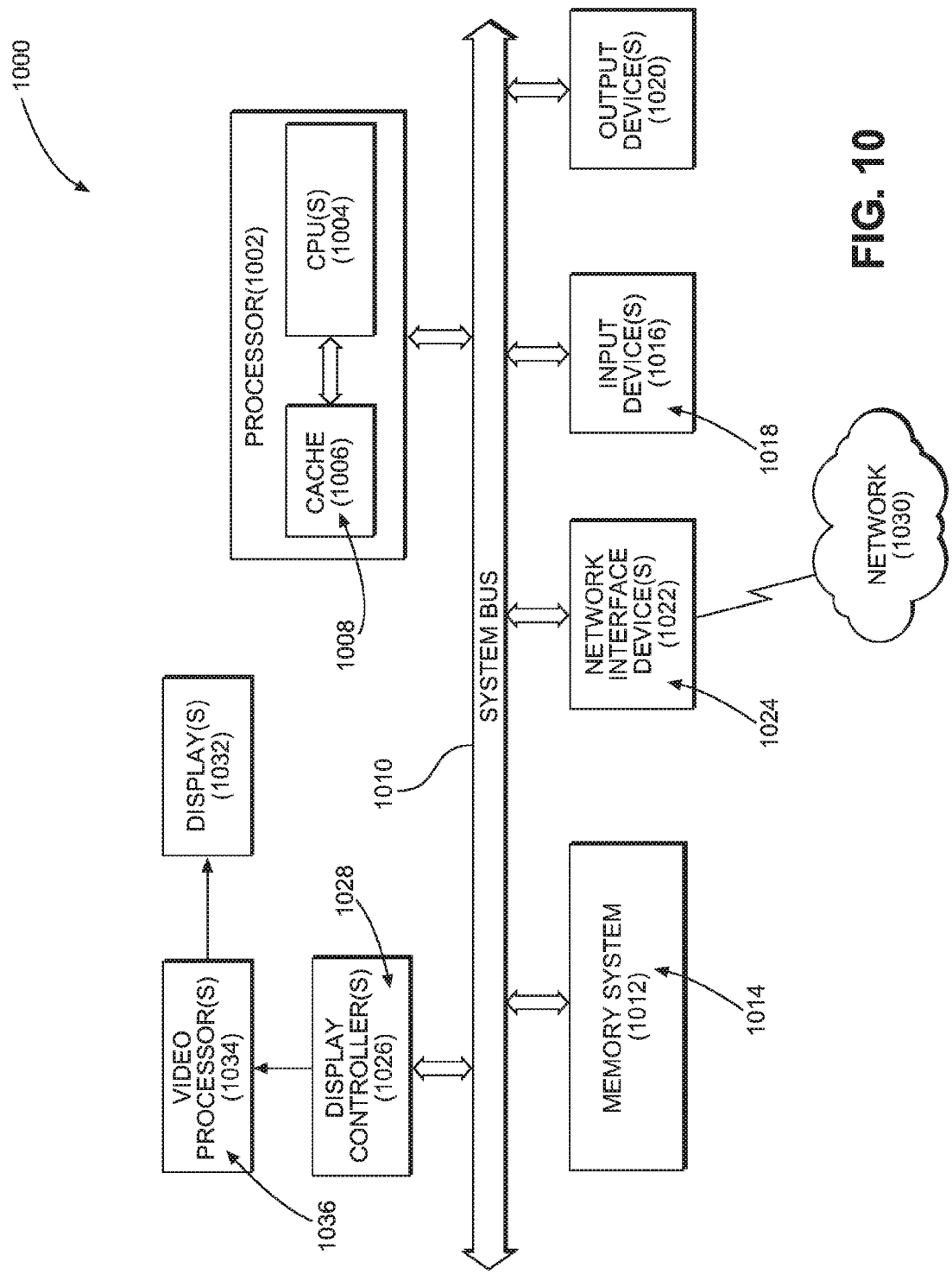
FIG. 10 is a block diagram of an exemplary processor-based system that can include pMTJs that have a pinned layer having a transitioning start to a BCC crystalline/amorphous structure below an AP2 layer to promote a high TMR with a reduced pinned layer thickness, including but not limited to the pMTJ illustrated in FIG. 4.

In this regard, FIG. 10 illustrates an example of a processor-based system 1000 that can include memory components that include pMTJs that include a pinned layer having a transitioning layer providing a transitioning start to a BCC crystalline/amorphous structure below an AP2 layer. In this example, the processor-based system 1000 includes a processor 1002 that includes one or more CPUs 1004. The processor 1002 may have cache memory 1006 coupled to the CPU(s) 1004 for rapid access to temporarily stored data. The cache memory 1006 may include pMTJs 1008 that include a pinned layer having a transitioning layer providing a transitioning start to a BCC crystalline/amorphous structure below an AP2 layer. The processor 1002 is coupled to a system bus 1010 and can intercouple master and slave devices included in the processor-based system 1000. As is well known, the processor 1002 communicates with these other devices by exchanging address, control, and data information over the system bus 1010. Although not illustrated in FIG. 10, multiple system buses 1010 could be provided, wherein each system bus 1010 constitutes a different fabric. For example, the processor 1002 can communicate bus transaction requests to a memory system 1012 as an example of a slave device. The memory system 1012 may include memory structures or arrays that include pMTJs 1014 that include a pinned layer having a transitioning layer providing a transitioning start to a BCC crystalline/amorphous structure below an AP2 layer, as an example.

Other master and slave devices can be connected to the system bus 1010. As illustrated in FIG. 10, these devices can include the memory system 1012, one or more input devices 1016, which can include pMTJs 1018 that include a pinned layer having a transitioning layer providing a transitioning start to a BCC crystalline/amorphous structure below an AP2 layer as an example, one or more output devices 1020, one or more network interface devices 1022, which can include pMTJs 1024 that include a pinned layer having a transitioning layer providing a transitioning start to a BCC crystalline/amorphous structure below an AP2 layer as an example, and one or more display controllers 1026, that can include pMTJs 1028 that include a pinned layer having a transitioning layer providing a transitioning start to a BCC crystalline/amorphous structure below an AP2 layer, as examples. The input device(s) 1016 can include any type of input device, including but not limited to input keys, switches, voice processors, etc. The output device(s) 1020 can include any type of output device, including but not limited to audio, video, other visual indicators, etc. The network interface device(s) 1022 can be any devices configured to allow exchange of data to and from a network 1030. The network 1030 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1022 can be configured to support any type of communications protocol desired.

The processor 1002 may also be configured to access the display controller(s) 1026 over the system bus 1010 to control information sent to one or more displays 1032. The display controller(s) 1026 sends information to the display(s) 1032 to be displayed via one or more video processors 1034, which process the information to be displayed into a format suitable for the display(s) 1032. The video processor(s) 1034 can include pMTJs 1036 that include a pinned layer having a transitioning layer providing a transitioning start to a BCC crystalline/amorphous structure below an AP2 layer, as an example. The display(s) 1032 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A perpendicular magnetic tunnel junction (pMTJ), comprising:
   a bottom electrode and a top electrode;
   a pinned layer disposed between the bottom electrode and the top electrode;
   a free layer disposed between the pinned layer and the top electrode; and a tunnel barrier layer disposed between the pinned layer and the free layer, the tunnel barrier layer configured to provide a tunnel magnetoresistance between the pinned layer and the free layer;

the pinned layer comprising a synthetic anti-ferromagnetic (SAF) structure, comprising:
- a first anti-parallel (AP) layer having a first reference magnetic orientation, the first AP layer comprising a face-centered cubic (FCC) or hexagonal closed packed (HCP) crystalline structure material;
- an anti-ferromagnetic coupling (AFC) layer disposed above the first AP layer;
- a second AP layer disposed above the AFC layer, the second AP layer having a second reference magnetic orientation opposite of the first reference magnetic orientation, the second AP layer comprising a body-centered cubic (BCC) crystalline or amorphous structure; and
- a transitioning layer disposed below the second AP layer, in the first AP layer as an interface between the first AP layer and the AFC layer to provide a transitioning start to the BCC crystalline or amorphous structure of the second AP layer.

2. The pMTJ of claim 1, wherein the transitioning layer is disposed as a last layer of the first AP layer adjacent to the AFC layer.

3. The pMTJ of claim 1, wherein the transitioning layer is comprised of Iron (Fe).

4. The pMTJ of claim 1, wherein the transitioning layer is comprised of a BCC crystalline structure material.

5. The pMTJ of claim 1, wherein the AFC layer is comprised of Chromium (Cr).

6. The pMTJ of claim 1, wherein the AFC layer is comprised of a BCC crystalline structure material.

7. The pMTJ of claim 1, wherein the second AP layer comprises a Cobalt (Co)-Iron (Fe)-Boron (B) (CoFeB) material.

8. The pMTJ of claim 1, wherein the second AP layer comprises a BCC crystalline structure material.

9. The pMTJ of claim 1, wherein the second AP layer comprises an amorphous material.

10. The pMTJ of claim 1, wherein the first AP layer comprises a Cobalt (Co) material and Platinum (Pt) material.

11. The pMTJ of claim 7, wherein the first AP layer is comprised of at least one of a Co layer and at least one of a Platinum (Pt) layer.

12. The pMTJ of claim 1, wherein the first AP layer comprises a face-centered cubic (FCC) crystalline structure material.

13. The pMTJ of claim 1, wherein the first AP layer comprises a hexagonal closed packed (HCP) crystalline structure material.

14. The pMTJ of claim 1, wherein:
the AFC layer is comprised of Cr;
the second AP layer comprises a CoFeB material; and
the tunnel barrier layer comprises Magnesium Oxide (MgO).

15. The pMTJ of claim 1, wherein the AFC layer is one (1) nanometer (nm) or less in thickness.

16. The pMTJ of claim 1, wherein the second AP layer is less than or equal to 1 nm in thickness.

17. The pMTJ of claim 1, wherein the first AP layer is below four (4) nanometers (nm) in thickness.

18. The pMTJ of claim 1 integrated into an integrated circuit (IC).

19. The pMTJ of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

20. A method for forming a perpendicular magnetic tunnel junction (pMTJ), comprising:
providing a bottom electrode and a top electrode;
forming a pinned layer above the bottom electrode comprising forming a synthetic anti-ferromagnetic (SAF) structure above the bottom electrode, comprising:
- forming a first anti-parallel (AP) layer having a first reference magnetic orientation and comprising a face-centered cubic (FCC) or hexagonal closed packed (HCP) crystalline structure material above the bottom electrode;
- forming a transitioning layer within the first AP layer as an interface between the first AP layer and an anti-ferromagnetic coupling (AFC) layer to provide a transitioning start to a structure of a second AP layer;
- forming the AFC layer above the transitioning layer; and
- forming the second AP layer above the AFC layer, the second AP layer having a second reference magnetic orientation opposite of the first reference magnetic orientation, the second AP layer comprising a body-centered cubic (BCC) crystalline or amorphous structure; and forming a tunnel barrier layer above the second AP layer, the tunnel barrier layer configured to provide a tunnel magnetoresistance between the pinned layer and a free layer; and forming the free layer disposed above the pinned layer, between the pinned layer and the top electrode.

21. The method of claim 20, comprising forming the transitioning layer as a last layer of the first AP layer adjacent to the AFC layer.

22. The method of claim 21, wherein forming the transitioning layer comprises forming the transitioning layer comprising Iron (Fe) as the last layer of the first AP layer to provide the transitioning start to the structure of the second AP layer.

23. The method of claim 21, wherein forming the transitioning layer comprises forming the transitioning layer comprising a BCC crystalline structure material as the last layer of the first AP layer to provide the transitioning start to the structure of the second AP layer.

24. The method of claim 20, wherein forming the AFC layer comprises forming the AFC layer comprising Chromium (Cr) above the transitioning layer.

25. The method of claim 20, wherein forming the second AP layer comprises forming a CoFeB material above the AFC layer.

26. A memory bit cell, comprising:
an access transistor having a gate, a source, and a drain; and
a perpendicular magnetic tunnel junction (pMTJ), comprising:
- a bottom electrode and a top electrode;
- a pinned layer disposed between the bottom electrode and the top electrode;

a free layer disposed between the pinned layer and the top electrode; and a tunnel barrier layer disposed between the pinned layer and the free layer, the tunnel barrier layer configured to provide a tunnel magnetoresistance between the pinned layer and the free layer;

the pinned layer comprising a synthetic anti-ferromagnetic (SAF) structure, comprising:

a first anti-parallel (AP) layer having a first reference magnetic orientation, the first AP layer comprising a face-centered cubic (FCC) or hexagonal closed packed (HCP) crystalline structure material;

an anti-ferromagnetic coupling (AFC) layer disposed above the first AP layer;

a second AP layer disposed above the AFC layer, the second AP layer having a second reference magnetic orientation opposite of the first reference magnetic orientation, the second AP layer comprising a body-centered cubic (BCC) crystalline or amorphous structure; and a transitioning layer disposed below the second AP layer, in the first AP layer as an interface between the first AP layer and the AFC layer and configured to provide a transitioning start to the BCC crystalline or amorphous structure of the second AP layer;

wherein:

the gate of the access transistor is coupled to a word line;

the bottom electrode of the pMTJ is coupled to the drain of the access transistor or the source of the access transistor; and the top electrode of the pMTJ is coupled to a bit line.

27. The memory bit cell of claim 26, wherein the transitioning layer is disposed as a last layer of the first AP layer adjacent to the AFC layer.

28. The memory bit cell of claim 26, wherein:

the AFC layer is comprised of a BCC crystalline structure material; and the second AP layer comprises a BCC crystalline structure material or amorphous material.

29. The memory bit cell of claim 26, wherein the first AP layer comprises a face-centered cubic (FCC) crystalline structure material or a hexagonal closed packed (HCP) crystalline structure material.

* * * * *